United States Patent
Hegedus

Patent Number: 4,614,639
Date of Patent: Sep. 30, 1986

[54] COMPOUND FLOW PLASMA REACTOR

[75] Inventor: Andreas G. Hegedus, Albany, Calif.

[73] Assignee: Tegal Corporation, Novato, Calif.

[21] Appl. No.: 727,937

[22] Filed: Apr. 26, 1985

[51] Int. Cl.⁴ .................. B01J 19/08; H05H 1/00; H05H 1/24
[52] U.S. Cl. .................. 422/186.05; 422/186.04; 422/906; 204/298; 156/345
[58] Field of Search .................. 422/186.04, 186.05, 422/186.06, 906; 204/298, 192 E; 156/345

[56] References Cited

U.S. PATENT DOCUMENTS 3,859,535  1/1975  Bartz .................. 204/298
4,209,357  6/1980  Gorin et al. .................. 156/345

FOREIGN PATENT DOCUMENTS 0102022  6/1982  Japan .................. 156/345

*Primary Examiner*—John F. Terapane
*Assistant Examiner*—Susan Wolffe
*Attorney, Agent, or Firm*—Paul F. Wille

[57] ABSTRACT

A plasma reactor is described in which radially outward and radially inward gas flows are adjusted to maintain uniformity for different wafer sizes and to compensate for loading effects. Inlet ports are provided about the sides of a reactor chamber and at a central position in the top of the chamber, the latter being provided with a flared, tubular structure. Exhaust ports are located about the sides of the chamber. The gas flow from the side inlet ports may have a tangential component.

9 Claims, 2 Drawing Figures

COMPOUND FLOW PLASMA REACTOR

BACKGROUND OF THE INVENTION

This invention relates to plasma reactor apparatus and, in particular, to a new structure for the control of gas flow within the reactor.

As known in the art, a considerable variety exists among the plasma reactors used in the semiconductor industry, e.g. for etching semiconductor wafers. There are what are known as barrel reactors, multi-electrode reactors, and parallel plate reactors. Each has its own characteristics, even when running what may arguably be the same process.

Parallel plate reactors usually process a single wafer at a time. While seemingly slower than batch operations in a barrel reactor, actual throughput is not actually very different since process rates tend to be higher in a parallel plate reactor. The major advantage of parallel plate reactors lies in the greater control of the process which this apparatus enables. Even among parallel plate reactors there are differences. One such difference is the manner in which reactant gases are supplied to the wafer.

In a first technique, gas is supplied to the wafer from a single port positioned above the central portion of the wafer. Gas and by-products are collected about the periphery of the wafer. Hence this reactor is often referred to a a radial flow reactor.

In a second technique, gas is supplied and exhausted from a plurality of ports located over the face of the upper electrode. This "spray nozzle" design seeks to avoid the dead spot which may form in the center of the wafer, directly under the pas ports resulting in an center-to-edge clearing pattern.

While each of these techniques is effective, there is a continuing need for ever greater uniformity across the surface of the wafer. As is known, the etch characteristics of some materials depends more on the electrical characteristics of the plasma than on the supply of gases. For example, polycrystalline silicon ("poly") is not particularly dependent on gas flow for etch uniformity. Poly has an ion bombardment limited etch. On the other hand, the etching of aluminum is sensitive to the supply of gases. This is not to say that the electrical characteristics of the plasma do not matter, only that gas flow has a more significant effect on the uniformity of the etch in the case of aluminum.

Thus, while all processes can benefit from improved uniformity, the present invention is especially useful for those processes which are reactant dependent. This is not to say that the supply of gas is particularly uniform, at least at any given time. Rather the present invention is directed to providing superior control within a plasma reactor in order to accommodate other changes which may be made and which would normally upset the process being run.

It is desired to have plasma reactors capable of accommodating various processes and wafer sizes without having to have a separate reactor for each. For example, changing wafer size changes the "loading" of the chamber. Process parameters must be modified to accommodate the change or the process is useless. Until now, it has been difficult to accommodate the change, particular in radial flow reactors, particularly as wafer sizes increase.

In view of the foregoing, it is therefore an object of the present invention to provide improved gas flow control for plasma reactors.

Another object of the present invention is to provide means for controlling the flow of gases within a plasma reactor so that changes in process or dimensions can be accommodated.

A further object of the present invention is to obtain improved uniformity from plasma processes.

Another object of the present invention is to reduce the edge-to-center clearing pattern of radial flow reactors.

SUMMARY OF THE INVENTION

The foregoing objects are achieved in the present invention wherein a compound flow is obtained from a central gas port and a plurality of peripheral gas ports. The flows are balanced so that the result is a more uniform etch. In particular, an edge-to-center component of the etch is balanced against a center-to-edge component of the etch. In so doing various wafer diameters and processes, e.g. frontside and backside etches of poly, resist, aluminum, oxides, or nitrides, can be accommodated.

DETAILED DESCRIPTION OF THE INVENTION

Figure 1:
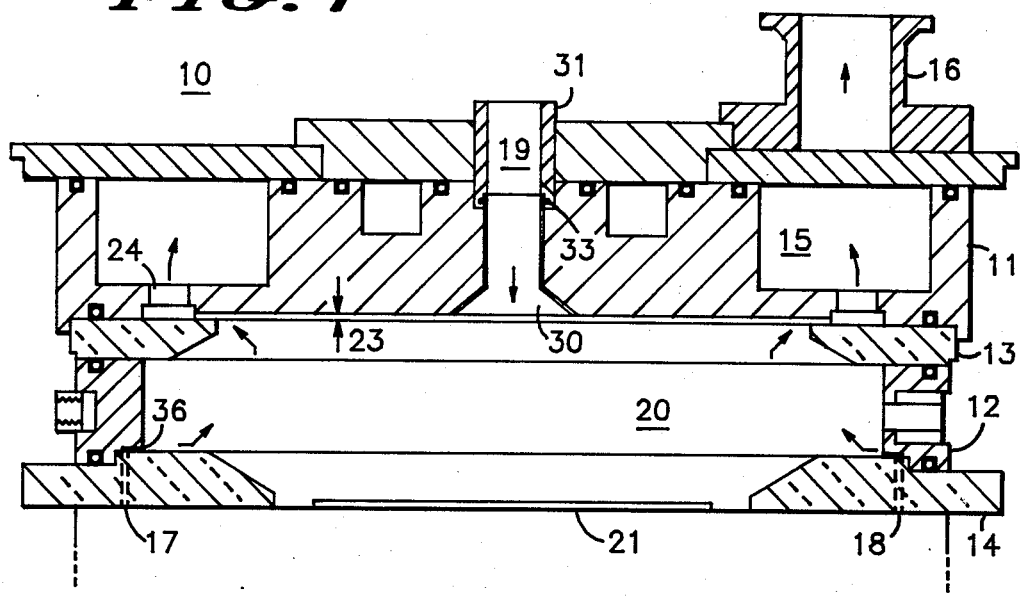
FIG. 1 illustrates a preferred embodiment of the present invention.

FIG. 1 illustrates in cross-section a preferred embodiment of the present invention wherein a radial flow of gases is provided by a central port having a flared end portion and a radially inward flow is provided from a plurality of ports about the periphery of the chamber. In particular, reactor 10 comprises an upper electrode 11 separated from sidewall member 12 by insulator 13. A lower electrode, not shown, fits insulating member 14 which serves to electrically isolate the lower electrode, which is typically RF hot, from sidewall 12. Upper electrode 11 is typically grounded. In this configuration, one has what is known as a diode reactor wherein the radio frequency signal is applied to one electrode. It is also known to provide two frequencies of RF power, one to the lower electrode and the other to sidewall 12. Alternatively, two or more frequencies can be applied to the lower electrode.

Upper electrode 11 defines plenum 15 which can conveniently comprise an annular chamber. Plenum 15 serves to collect exhaust gases for exhaust member 16. In accordance with the present invention, gas is supplied to chamber 20 by way of inlets 17 and 18, and others, located about the periphery of insulator 14. This provides a radially inward flow, which can have a tangential component. In addition, gas, or a gas mixture, is supplied through port 19 in upper electrode 11. Port 19 terminates in a flared portion formed in upper electrode 11. It has been found that this flared portion can be in the range of 30 to 60 degrees, with approximately 45 degrees being preferable.

Since some gases are harsh, e.g. BCl₃, it is preferable to provide an insert for port 19 in upper electrode 11. Specifically, glass tube 30 having a matching flare therein is inserted into port 19 and sealed by way of locking means 31 and compressible seal 33.

The gas supplied by bores 17 and 18 flows through gap 26 between insulator 14 and sidewall 12. The gases mix with the gas from port 19 to provide a continuous supply of reactant materials above semiconductor wafer 21, which is position on top of the lower electrode. Excess gas and by-products is exhausted through gap 23 between insulator 13 and upper electrode 11, through bore 24 to plenum 15. The number end location of peripheral bores 17, 18 is not critical provided that there is a sufficient number to provide a relative uniform flow from the edge to towards the center of the wafer. This, in part, depends upon the distance from bores 17, 18 to the edge of wafer 21. In a particular embodiment of the present invention wherein wafer 21 comprise a four inch wafer with approximately one inch of space from the edge of wafer 21 to one of the peripheral bores, it has been found that six bores located relatively uniformly about the periphery produces an adequate supply.

The relative flows between the peripheral bores and port 19 can be adjusted relative to one another to provide maximum uniformity across the surface of wafer 21. In a particular use the present invention for etching and aluminum layer on a four inch semiconductor wafer it was found that approximate equal flows produced the desired result. Equal flows may not be correct for all situations, i.e. balanced flows are not necessarily equal flows. In determining the optimum combination, one attempts to obtain a linear or nearly linear center-to-edge or edge-to-center effect, each determined separately. Flow, pressure, wafer temperature, etc. are adjusted to obtain linearity. For the radially outward flow, i.e. from port 19, the shape of the flare is adjusted as well. Combining the two flows, and hence the linear effects, provides a very good starting point for the final process parameters, i.e. very little final adjustment is necessary.

Figure 2:
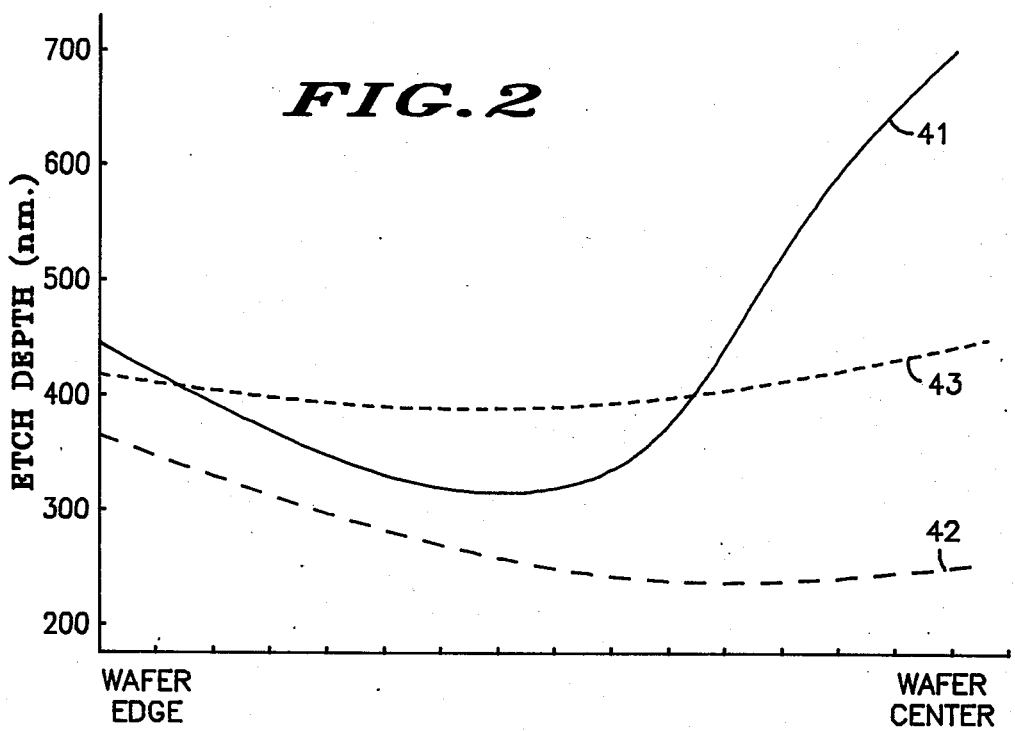
FIG. 2 illustrates the etches resulting from the separate and combined gas flows.

FIG. 2 illustrates the operation of the apparatus illustrated in FIG. 1. In particular, curve 41 illustrates the operation of the apparatus utilizing a gas flow through port 19 with no taper. Curve 42 illustrates the operation of the apparatus utilizing only a gas flow through the peripheral ports. Curve 43 illustrates the operation with a combined flow through both the peripheral ports and central port 19 with a 45 degree taper. As can be seen from FIG. 2, the combined flows provide significantly improved uniformity then obtained with either flow individually. In particular, the gas mixture comprised 40% $SiCl_4$, 40% $Cl_2$, and 20% $CHCl_3$ at a pressure of 140 mtorr. The applied RF comprised 300 watts at 13.56 MHz and 25 watts at 100 KHz. In arriving at the process for curve 43, each of the other curves was adjusted, as indicated above, to obtain as linear an etch as possible. The effects are then combined to produce, while not the maximum etch rate, a very uniform etch.

There is thus provided by the present invention an improved plasma reactor apparatus which enables one to obtain significantly more uniform results in apparatus adaptable to a variety of wafer sizes and processes.

Having thus described the invention it will be apparent to those of skill in the art that various modifications can be made within the spirit and scope of the present invention. For example, as previously indicated, a linear can be provided for harsh gases. While illustrated as flowing through a gap between sidewall 12 and insulator 14, one could separately provide for the inward flow of gas from sidewall 12 by way of a plurality of bores in sidewall 12 itself. The taper in upper electrode 11 is illustrated as having straight sides since this is the simplest to machine. It is understood that a curved surface can be used instead.

I claim:

1. In plasma reactor apparatus including a reaction chamber in which is placed an article to be treated, the improved comprising:
    an upper electrode having a central bore therein for supplying gas to flow radially outwardly across said article;
    sidewall means for supplying gas to flow radially inwardly across said article;
    wherein said central bore terminates in a flared portion in the range of 30 to 60 degrees.

2. The apparatus as set forth in claim 1 wherein said flared portion has a linear taper.

3. The apparatus as set forth in claim 2 wherein said second member comprises an insulator.

4. The apparatus as set forth in claim 1 and further comprising means for lining said central bore.

5. The apparatus as set forth in claim 4 wherein said lining means comprises a flared portion matching the flared portion in said bore.

6. The apparatus as set forth in claim 5 wherein said lining means comprises glass.

7. The apparatus as set forth in claim 1 wherein said upper electrode further defines an exhaust plenum.

8. The apparatus as set forth in claim 7 wherein said upper electrode comprises a plurality of bores about the periphery thereof for interconnecting said plenum and the lower surface of said electrode.

9. The apparatus as set forth in claim 8 and further comprising:
    insulating means connecting said upper electrode to said sidewall means.

* * * * *

UNITED STATES PATENT AND TRADEMARK OFFICE
CERTIFICATE OF CORRECTION

PATENT NO. : 4,614,639

DATED : September 30, 1986

INVENTOR(S) : Andreas G. Hegedus

It is certified that error appears in the above-identified patent and that said Letters Patent is hereby corrected as shown below:

Column 4, claim 1, line 28, after "article" insert --, said sidewall means having a sidewall member and a second member having a gap therebetween through which said gas flows--.

Signed and Sealed this

Twenty-seventh Day of January, 1987

Attest:

DONALD J. QUIGG

Attesting Officer     Commissioner of Patents and Trademarks